United States Patent
Iizuka

(10) Patent No.: US 10,149,403 B2
(45) Date of Patent: Dec. 4, 2018

(54) CONSOLE DRAWER

(71) Applicant: FUJITSU COMPONENT LIMITED, Tokyo (JP)

(72) Inventor: Kouji Iizuka, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 15/233,050

(22) Filed: Aug. 10, 2016

(65) Prior Publication Data

US 2017/0127554 A1    May 4, 2017

(30) Foreign Application Priority Data

Nov. 4, 2015    (JP) .................................. 2015-217123

(51) Int. Cl.
*H05K 7/14*    (2006.01)
*G06F 1/18*    (2006.01)

(52) U.S. Cl.
CPC ......... *H05K 7/1494* (2013.01); *H05K 7/1491* (2013.01); *G06F 1/181* (2013.01)

(58) Field of Classification Search
CPC ...... G06F 1/181–1/187; G06F 3/03541; G06F 3/03543; H05K 7/1491; H05K 7/1494
USPC ............ 361/679.01, 679.09, 679.21, 679.22, 361/679.26, 724–727; 312/223.1–223.3; 345/163
See application file for complete search history.

(56) References Cited

U.S. PATENT DOCUMENTS

| | | | | |
|---|---|---|---|---|
| 5,556,061 A * | 9/1996 | Dickie | ............. | G06F 3/0395 248/118 |
| 6,163,326 A * | 12/2000 | Klein | ............. | G06F 1/1616 345/156 |
| 6,205,021 B1 * | 3/2001 | Klein | ............. | G05G 9/047 345/167 |
| 6,442,030 B1 * | 8/2002 | Mammoser | ......... | G06F 1/1601 248/917 |
| 6,803,525 B1 * | 10/2004 | Liao | ............. | H02G 11/02 174/117 F |
| 8,882,016 B1 * | 11/2014 | Melvin | ............. | B65H 75/4431 242/395.1 |
| 2004/0080899 A1 * | 4/2004 | Hill | ............. | G06F 1/1616 361/679.1 |
| 2004/0178991 A1 * | 9/2004 | Wei | ............. | B65H 75/48 345/163 |
| 2004/0201574 A1 * | 10/2004 | Wei | ............. | G06F 3/039 345/163 |
| 2005/0035262 A1 * | 2/2005 | Seki | ............. | A47B 21/0314 248/441.1 |
| 2006/0232917 A1 | 10/2006 | Wu et al. | | |

(Continued)

FOREIGN PATENT DOCUMENTS

CN    203259986    * 10/2013 ........... G06F 3/0354
JP    2006-302245    11/2006

OTHER PUBLICATIONS

Japanese Platform for Patent Information, Publication No. 2006-302245, published Nov. 2, 2006.

*Primary Examiner* — Steven T Sawyer
*Assistant Examiner* — Sagar Shrestha
(74) *Attorney, Agent, or Firm* — Staas & Halsey LLP

(57) ABSTRACT

A console drawer to be mounted on a server rack, including: a mouse storage unit storing a mouse; and a mouse cable storage unit including a winding unit around which a mouse cable of the mouse is wound.

9 Claims, 9 Drawing Sheets

(56) References Cited

U.S. PATENT DOCUMENTS

| | | | | |
|---|---|---|---|---|
| 2007/0262955 | A1* | 11/2007 | Seki | G06F 1/18 |
| | | | | 345/156 |
| 2010/0158300 | A1* | 6/2010 | Wang | A47B 23/043 |
| | | | | 381/333 |
| 2012/0169602 | A1* | 7/2012 | Ma | H02G 11/02 |
| | | | | 345/163 |
| 2013/0168481 | A1* | 7/2013 | Guo | B65H 75/4431 |
| | | | | 242/379 |
| 2017/0013343 | A1* | 1/2017 | Tomlinson | B65H 75/4431 |

* cited by examiner

CONSOLE DRAWER

CROSS-REFERENCE TO RELATED APPLICATION

This application is based upon and claims the benefit of priority of the prior Japanese Patent Application No. 2015-217123 filed on Nov. 4, 2015, the entire contents of which are incorporated herein by reference.

FIELD

A certain aspect of the embodiments is related to a console drawer.

BACKGROUND

There has been known a console drawer mounted on a server rack (e.g. see Japanese Laid-open Patent Publication No. 2006-302245). The console drawer includes a display, a keyboard module and a touch pad.

SUMMARY

According to an aspect of the present invention, there is provided a console drawer to be mounted on a server rack, including: a mouse storage unit storing a mouse; and a mouse cable storage unit including a winding unit around which a mouse cable of the mouse is wound.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The console drawer (e.g. see Japanese Laid-open Patent Publication No. 2006-302245) includes the touch pad for operating a mouse cursor, but there are a lot of users who want a mouse. A console drawer beforehand including a mouse exists. However, it may be hard for a user to employ the mouse provided in the console drawer because the mouse is thin or an operation range of the mouse is limited.

There is also a console drawer which includes a USB terminal on the front surface of the console drawer, and in which a user's favorite mouse can be attached to the USB terminal. However, the console drawer does not have a space for storing an retrofitted mouse and a retrofitted mouse cable. Therefore, when a user stores the console drawer into a server rack, the user needs to remove the retrofitted mouse from the USB terminal and to store the mouse separately.

A description will now be given of an embodiment according to the present invention with reference to drawings.

Figure 1:
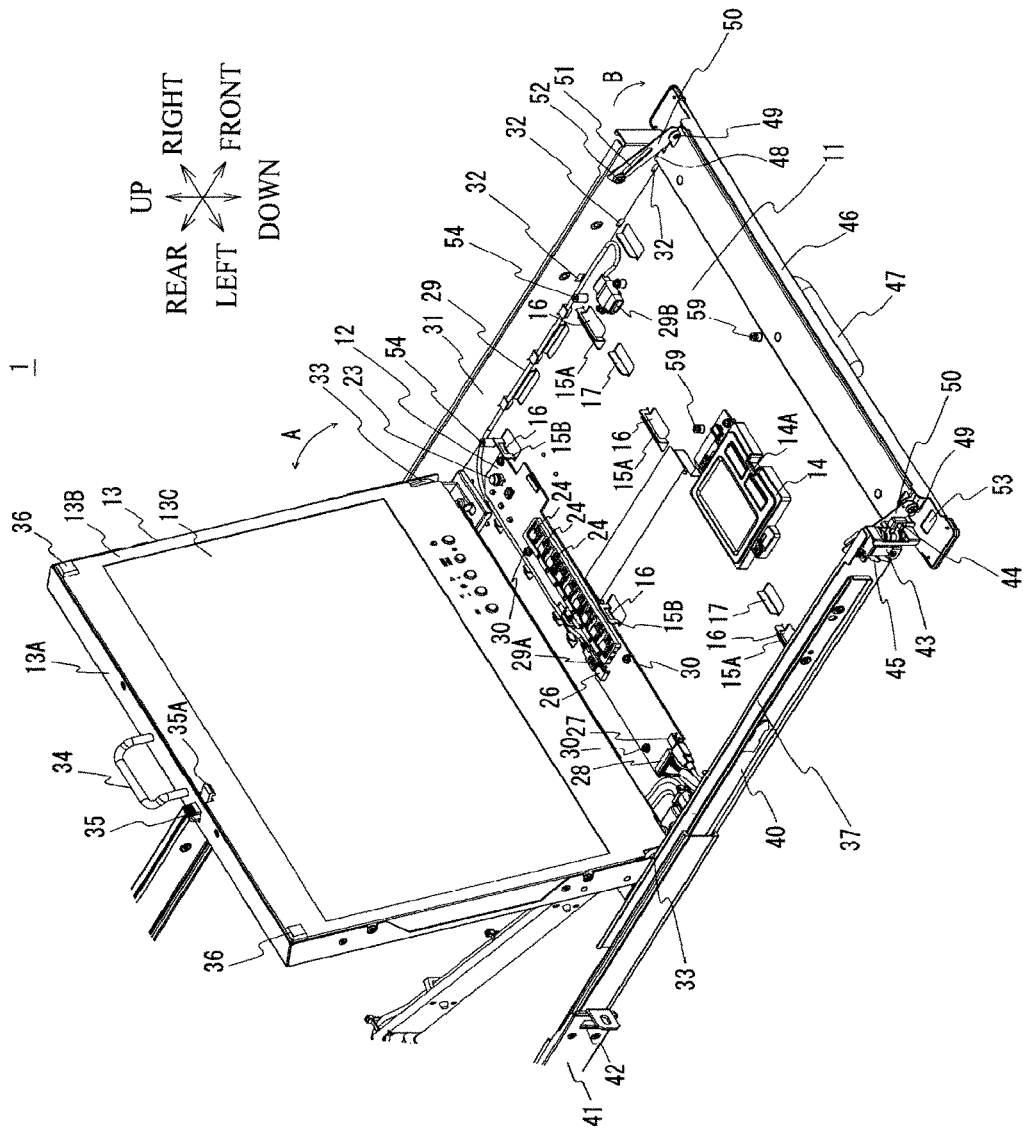
FIG. 1 is a diagram illustrating the schematic configuration of a console drawer according to an embodiment.
Figure 2A:
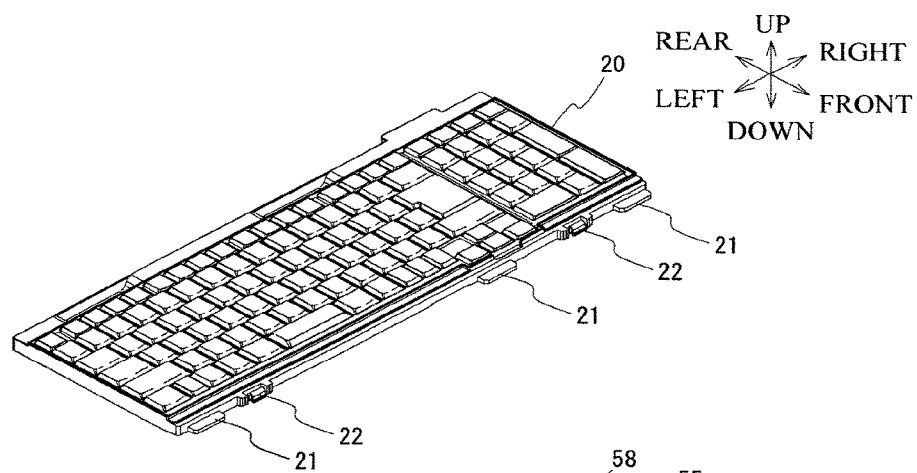
FIGS. 2A to 2C are diagrams illustrating components which are attached to the console drawer of FIG. 1.
Figure 2B:
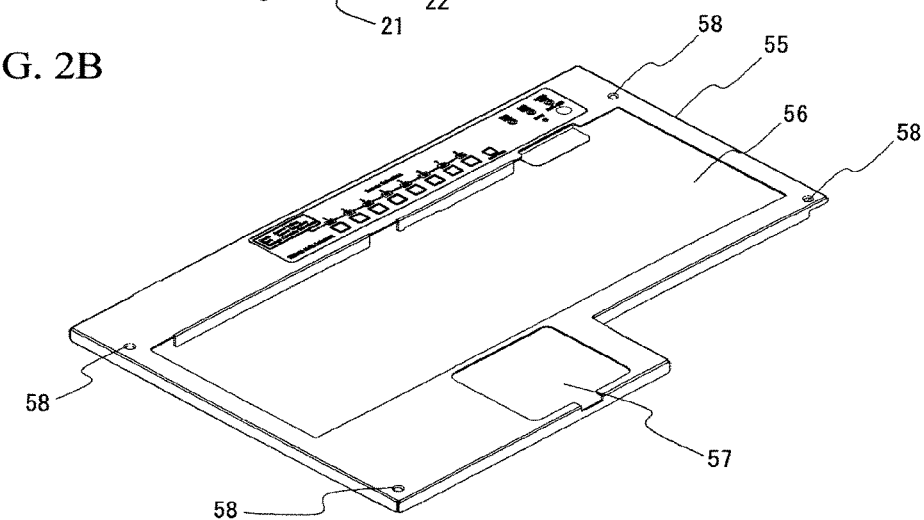
Figure 2C:
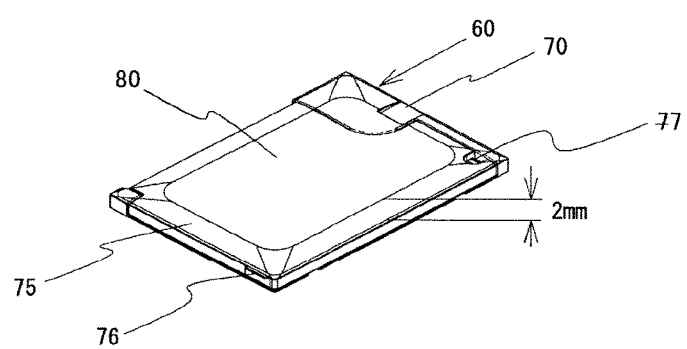

FIG. 1 is a diagram illustrating the schematic configuration of a console drawer according to an embodiment. FIGS. 2A to 2C are diagrams illustrating components which are attached to the console drawer of FIG. 1. In the following, front, rear, right, left, up and down detections are defined as illustrated in FIG. 1, for convenience.

A console drawer 1 is electrically connected to a KVM (K: keyboard, V: video, M: mouse) switch, not shown, that selectively switches a server to be operated from a plurality of servers mounted on a server rack.

As illustrated in FIG. 1, the console drawer 1 includes a bottom plate 11, a substrate 12 mounted on the bottom plate 11, a display 13, and a mouse pad 14. The bottom plate 11 includes: fixing portions 15A and 15B that are stood by cutting parts of the bottom plate 11, and fix a keyboard unit 20 (see FIG. 2A); and erect portions 17 that are erected by cutting parts of the bottom plate 11. A hole 16 is formed in the center of each of the fixing portions 15A and 15B. Moreover, the bottom plate 11 includes: a right sidewall 31 that is bent vertically upward from a right end of the bottom plate 11; and a left sidewall 37 that is bent vertically upward from a left end of the bottom plate 11.

As illustrated in FIG. 2A, a plurality of projections 21 and a plurality of energizing portions 22 are formed on a front lateral side of the keyboard unit 20. A plurality of projections 21, not shown, are formed on a rear lateral side of the keyboard unit 20. When the projections 21 provided on a front lateral side of the keyboard unit 20 are inserted into the holes 16 formed in the fixing portions 15A, the energizing portions 22 contact the erect portions 17 and energize the keyboard unit 20 backward. Thereby, the projections 21 provided on the rear lateral side of the keyboard unit 20 are inserted into the holes 16 formed in the fixing portions 15B, and the keyboard unit 20 is fixed on the bottom plate 11.

The substrate 12 includes: a hot key button 23 for activating a mode which can set the KVM switch; a plurality of buttons 24 for respectively selecting a plurality of ports included in the KVM switch; USB (Universal Serial Bus) connectors 26 and 27; and an exclusive connector 28. The substrate 12 includes a microcomputer and wirings, but they are omitted in FIG. 1. When the port included in the KVM is selected by the button 24, a selection signal is transmitted to the KVM switch via a cable connected to the exclusive connector 28. The cable connected to the exclusive connector 28 is connected to a power supply, not shown, and supplies an electrical power to the substrate 12. The substrate 12 is screwed on the bottom plate 11 with screws 30.

The USB connectors 26 and 27 are electrically connected to each other. The USB connector 26 is connected to a connector 29A of a USB cable 29. The USB cable 29 is put in front of the keyboard unit 20 along the right sidewall 31 of the bottom plate 11. A connector 29B of the USB cable 29 is screwed on the bottom plate 11 in front of the keyboard unit 20 and in the vicinity of the right sidewall 31. Holes 32 that engage with projections formed on the mouse cable storage unit described later are formed on the right sidewall 31 of the bottom plate 11.

Hinges 33 are provided at right-and-left lower ends of the display 13, and the display 13 is opened and closed in an A-direction of FIG. 1. A handle 34 and a lock mechanism 35 are formed on an upper surface 13A of the display 13. In a state where the display 13 is closed, a claw 35A of the lock mechanism 35 engages with a concave portion 14A of the mouse pad 14. By pulling up the display 13 while pushing down the lock mechanism 35 and removing the claw 35A from the concave portion 14A of the mouse pad 14, the display 13 becomes an opened state as illustrated in FIG. 1. Rubber legs 36 are stuck on right-and-left upper ends of a front surface 13B of the display 13 to prevent a display panel 13C of the display 13 from contacting the keyboard unit 20.

The right sidewall 31 and the left sidewall 37 of the bottom plate 11 are screwed between a pair of slide rails 40 of the server rack. A hole 42 is formed on a left rail cover 41 of the server rack. A lock mechanism 43 is provided on a front end of the left sidewall 37 of the bottom plate 11. When the console drawer 1 is stored into the server rack, a claw 45 of the lock mechanism 43 engages with the hole 42 of the left rail cover 41. In this state, when a pin 44 of the lock mechanism 43 is pushed on the left side, the claw 45 is released from the hole 42 and the console drawer 1 can be drawn forward.

A front cover 46 includes a hole 53 through which the pin 44 of the lock mechanism 43 passes. A handle 47 is provided on a front surface of the front cover 46. Right-and-left lower ends 48 of the front cover 46 at the time of erection of the front cover 46 (i.e., right-and-left rear ends of the front cover 46 in FIG. 1) are rotatably fixed to the right sidewall 31 and the left sidewall 37, respectively. Right-and-left upper ends of the front cover 46 at the time of erection of the front cover 46 (i.e., right-and-left front ends of the front cover 46 in FIG. 1) are fixed to one ends of support members 50 with screws 49, respectively. The support members 50 include guide grooves 51, respectively. Screws 52 are fixed to the right sidewall 31 and the left sidewall 37 via the guide grooves 51, respectively. When the handle 47 is pulled downward, the support members 50 move along the guide grooves 51, and the front cover 46 falls over forward from an erect state, i.e., rotates in a B-direction. When the handle 47 is pushed upward, the front cover 46 returns to the erect state.

Bosses 54 for screwing a cover 55 illustrated in FIG. 2B are formed on the bottom plate 11 of FIG. 1. The cover 55 includes a through-hole 56 that exposes the keyboard unit 20, a through-hole 57 that exposes the mouse pad 14, and screw holes 58 that cause screws to be screwed to the bosses 54 to pass through. In a state where the cover 55 is screwed to the bottom plate 11, the keyboard unit 20 is removable.

Moreover, bosses 59 for screwing a mouse cable storage unit 60 illustrated in FIG. 2C are formed on the bottom plate 11 of FIG. 1.

Figure 3A:
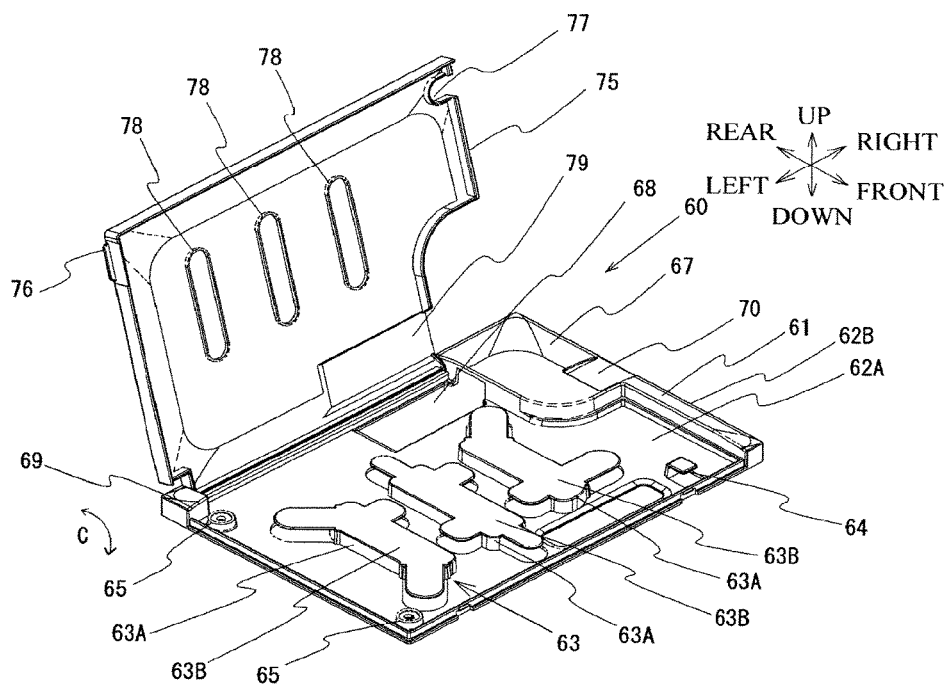
FIG. 3A is a perspective view of a mouse cable storage unit as seen from above.
Figure 3B:
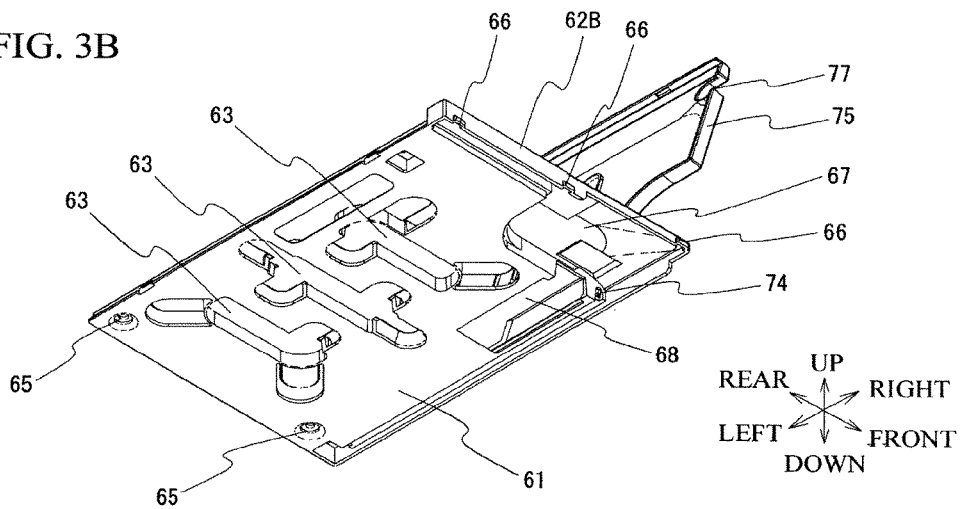
FIG. 3B is a perspective view of the mouse cable storage unit as seen from below.

FIG. 3A is a perspective view of the mouse cable storage unit 60 as seen from above. FIG. 3B is a perspective view of the mouse cable storage unit 60 as seen from below. The mouse cable storage unit 60 is almost formed in a box shape, and includes a base unit 61 and an upper cover 75. A plurality of winding units 63 around which a mouse cable is wound are formed on a bottom surface 62A of the base unit 61. Each winding unit 63 includes: a body portion 63A that stands up from the bottom surface 62A of the base unit 61, and around which the mouse cable is wound; and a head portion 63B that is formed in a plate shape on an upper end of the body portion 63A, and suppress the upward bulge of the mouse cable wound around the body portion 63A. In the present embodiment, the base unit 61 includes three winding units 63, but the number of winding units 63 is not limited to three. The number of winding units 63 may be two, or four or more. Also, the shape of the winding unit 63 is not limited to examples of FIGS. 3A and 3B.

The base unit 61 includes a hook unit 64 that are provided in a Γ-shape from the bottom surface 62A, and defines a length of the mouse cable by fixing the mouse cable extending outside the mouse cable storage unit 60. Screw holes 65 that cause screws to be screwed to the bosses 59 (see FIG. 1) to pass through are formed on the left end of the bottom surface 62A of the base unit 61. Projections 66 (see FIG. 3B) that engage with the holes 32 provided on the right sidewall 31 of the bottom plate 11 are formed on a right side surface 62B of the base unit 61. The projections 66 engage with the holes 32 provided on the right sidewall 31 of the bottom plate 11 and the bottom surface 62A of the base unit 61 is screwed to the bosses 59 via the screw holes 65, so that the mouse cable storage unit 60 is fixed to the bottom plate 11.

Moreover, a protrusive unit 67 that projects upward from the bottom surface 62A of the base unit 61 is formed on a right-side rear end of the base unit 61. As illustrated in FIG. 3B, a space is formed under the protrusive unit 67. When the mouse cable storage unit 60 is attached to the bottom plate 11, the connector 29B of the USB cable 29 fixed to the bottom plate 11 is arranged in the space under the protrusive unit 67. An opening 68 for inserting the connector of the mouse cable into the connector 29B of the USB cable 29 is formed on a part of the protrusive unit 67 and the bottom surface 62A.

Rotary shafts 74 (see FIG. 3B) to be inserted into holes (not shown) formed on the protrusive unit 67 and a left sidewall 69 of the base unit 61 are formed on right-and-left lower ends of the upper cover 75 of FIG. 3A (i.e., right-and-left rear ends of the upper cover 75 of FIG. 2C). The rotary shafts 74 are inserted into the holes (not shown) formed on the protrusive unit 67 and the left sidewall 69 of the base unit 61, so that the upper cover 75 is coupled with the base unit 61, and can be opened and closed in a C-direction of FIG. 3A.

A knob 76 for lifting the upper cover 75 is formed on an upper portion of a left side surface of the upper cover 75 of FIG. 3A (i.e., a front side of the left side surface of the upper cover 75 of FIG. 2C). A groove 77 that passes the mouse cable from the mouse cable storage unit 60 to the outside is formed on an upper portion of a right side surface of the upper cover 75 of FIG. 3A (i.e., a front side of the right side surface of the upper cover 75 of FIG. 2C). Moreover, the thickness of a part 79 of the upper cover 75 opposite to the opening 68 is thin so as not to contact the connector of the mouse cable.

As illustrated in FIG. 2C, the upper cover 75 projects approximately 2 mm in a height direction (i.e., an upper direction) from the base unit 61 to increase a space storing the mouse cable. An upper surface (i.e., a top surface) 80 of the upper cover 75 is flat and becomes an operation table of a retrofitted mouse (hereinafter referred to as "a mouse"). A plurality of ribs 78 that project so as to be opposed to the head portions 63B of the winding units 63 are formed on a rear surface of the upper cover 75 of FIG. 3A. When the upper cover 75 is closed, the ribs 78 contact the head portions 63B of the winding units 63 to support the upper cover 75. Thereby, even when the mouse is operated on the upper surface 80 of the upper cover 75, the upper cover 75 can avoid bending.

Figure 4:
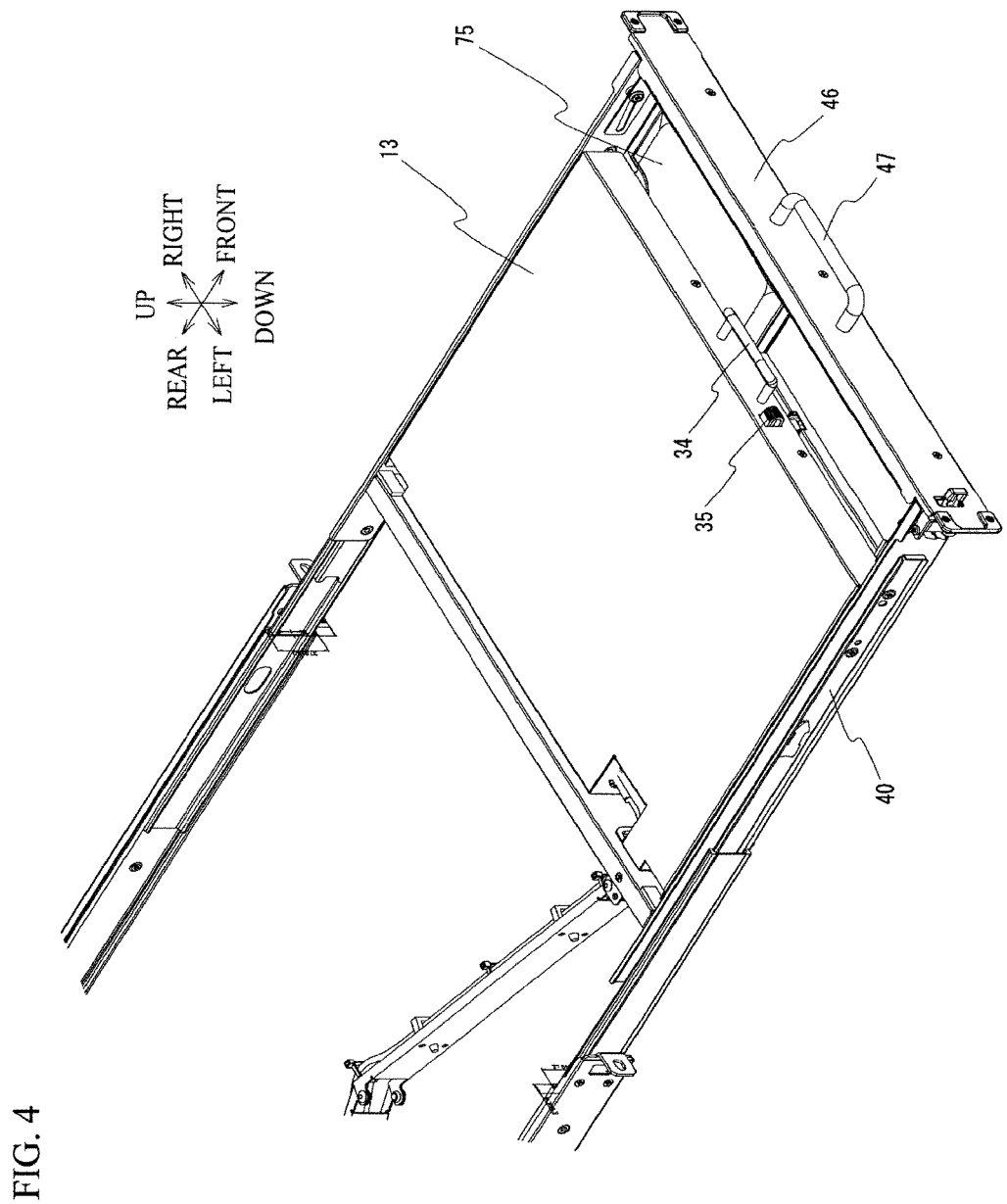
FIG. 4 is a perspective view of the console drawer when a display is closed.

Formed on an upper surface of the protrusive unit 67 is a concave portion 70 which contacts the rubber leg 36 stuck on a right upper end of the front surface 13B of the display 13 when the display 13 is closed. When the display 13 is closed as illustrated in FIG. 4, the rubber legs 36 stuck on the right-and left upper ends of the front surface 13B of the display 13 contact the concave portion 70 and the upper surface of the cover 55, respectively, so that a display panel 13C of the display 13 does not contact the mouse cable storage unit 60 (i.e., the upper surface 80 of the upper cover 75), the keyboard unit 20 and the mouse pad 14.

Figure 5:
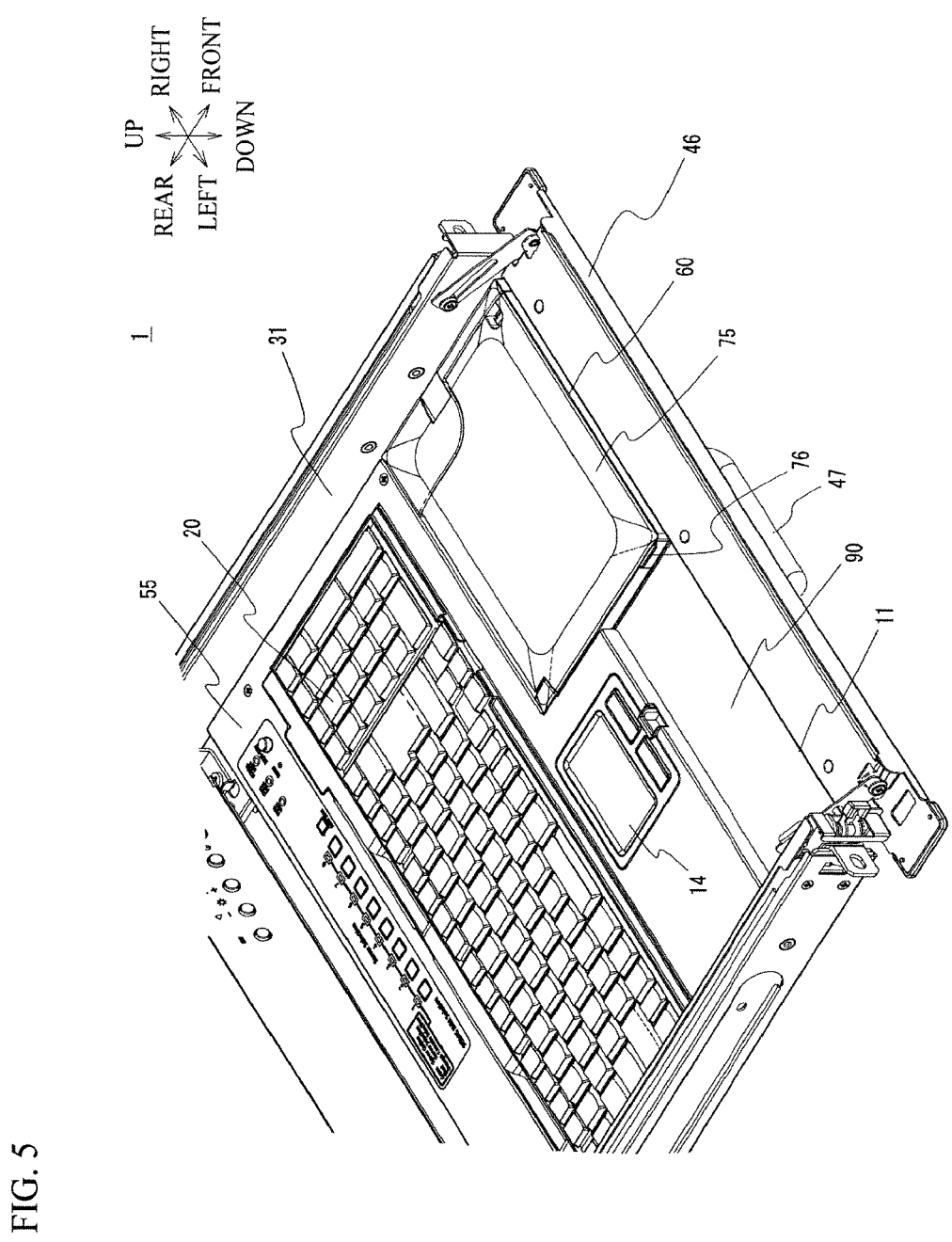
FIG. 5 is a perspective view of the console drawer on which a keyboard unit, a mouse pad, a cover and the mouse cable storage unit are mounted.

FIG. 5 is a perspective view of the console drawer 1 on which the keyboard unit 20, the mouse pad 14, the cover 55 and the mouse cable storage unit 60 are mounted.

As illustrated in FIG. 5, a mouse storage unit 90 storing the mouse is formed in front of the mouse pad 14 and on the left side of the mouse cable storage unit 60. The height of the mouse to be stored into the mouse storage unit 90 is preferably 4 cm or less. This is because the mouse cannot be stored in the mouse storage unit 90 when the total of the heights of the bottom plate 11 and the mouse exceeds a height (i.e., about 4.5 cm) of a 1 U server. By changing the length of the bottom plate 11 in the front and rear direction, the length of the mouse storage unit 90 in the front and rear direction can be changed. Moreover, by changing the width of the console drawer 1 in the right and left direction or the width of the mouse cable storage unit 60 in the right and left direction, the length of the mouse storage unit 90 in the right and left direction can be changed.

Figure 6:
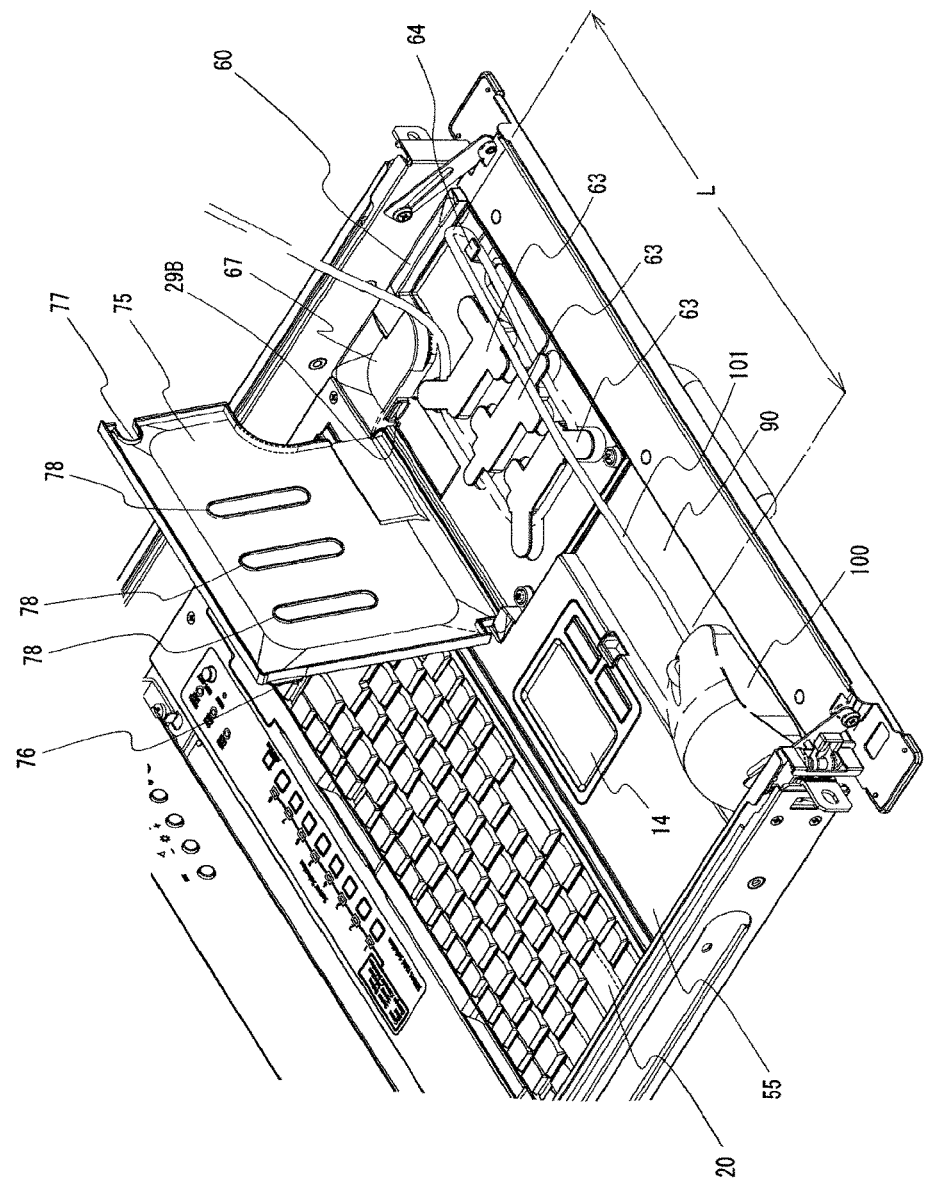
FIG. 6 is a diagram illustrating a method for storing the mouse.
Figure 7:
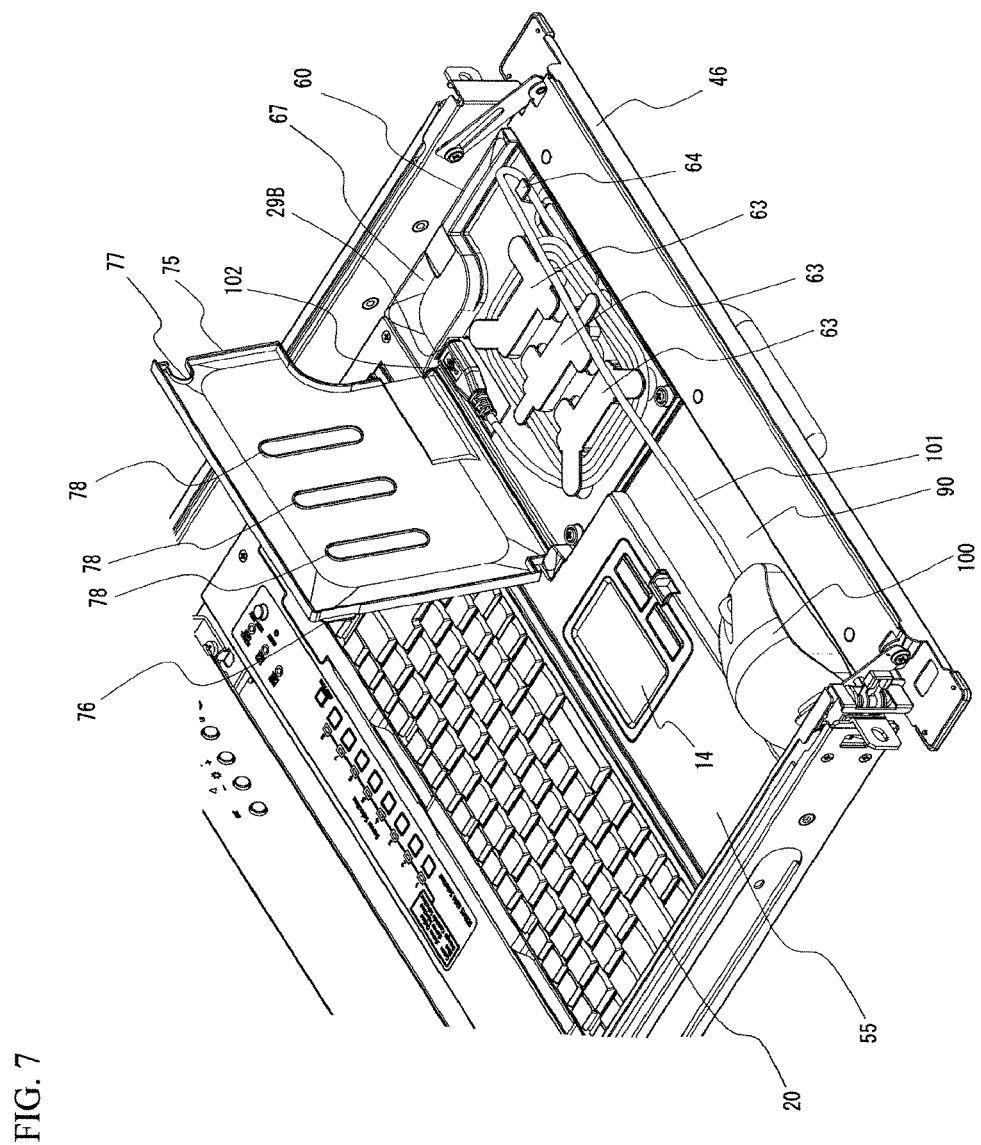
FIG. 7 is a diagram illustrating a method for storing the mouse.
Figure 8:
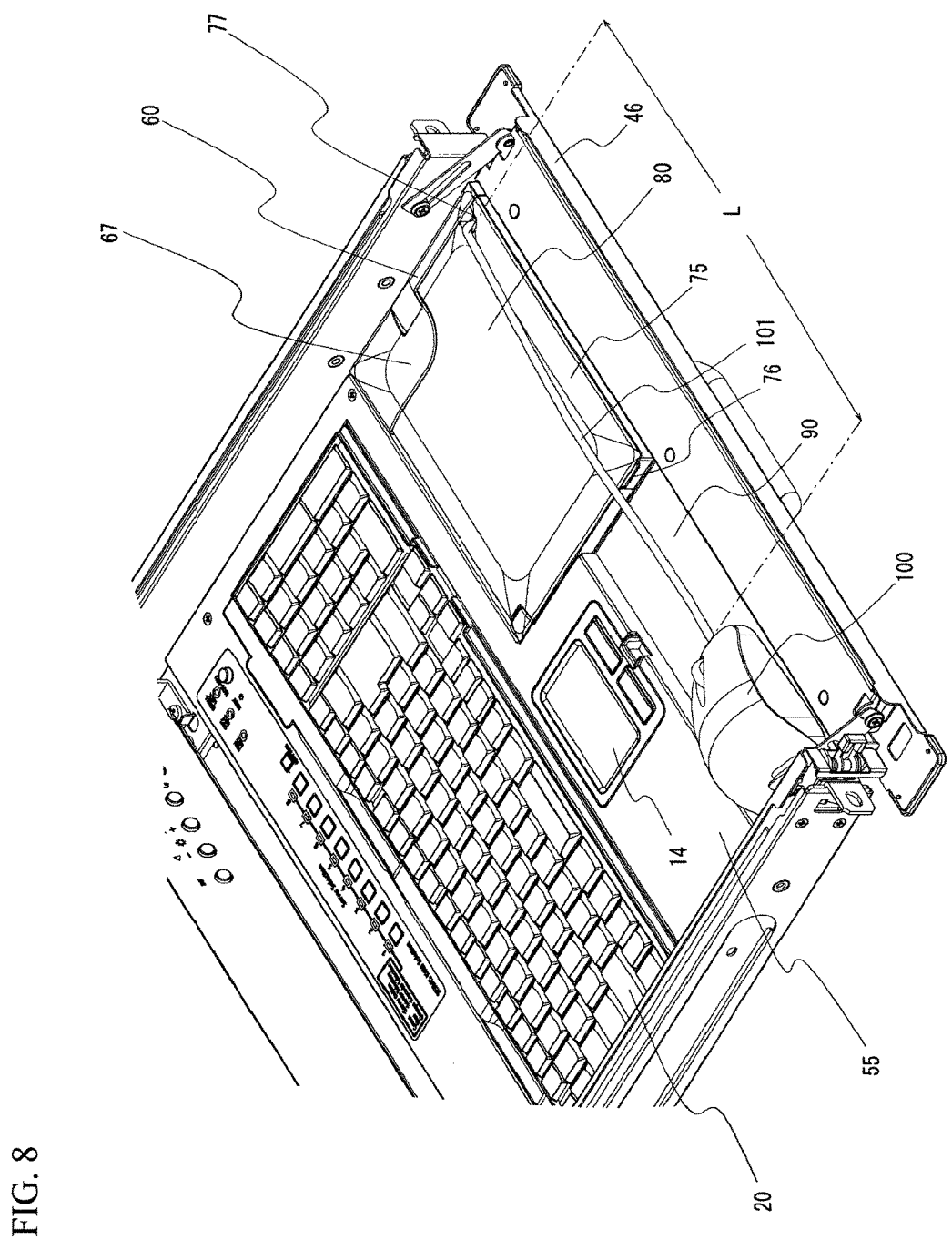
FIG. 8 is a diagram illustrating a method for storing the mouse.
Figure 9:
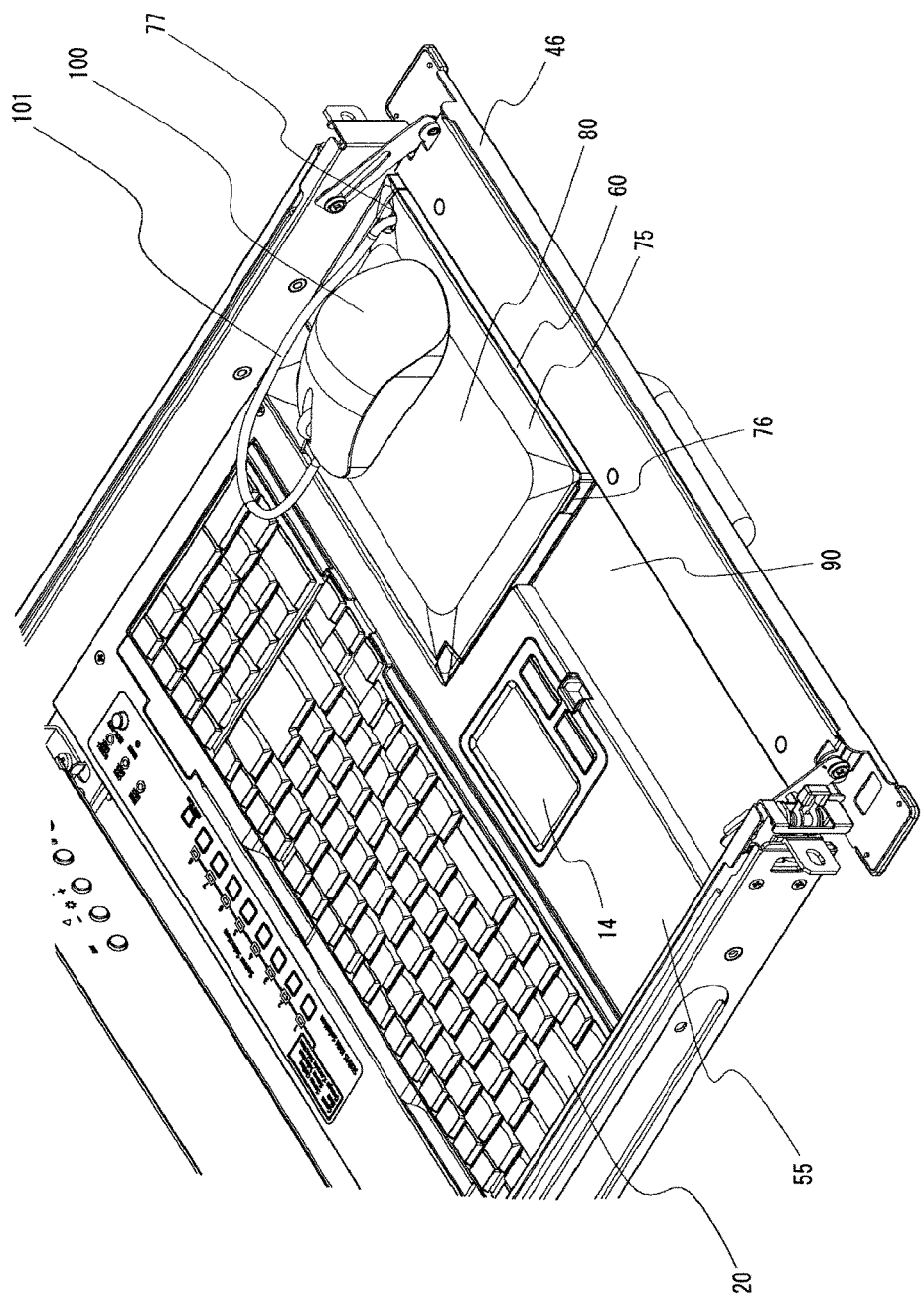
FIG. 9 is a diagram illustrating a use state of the mouse.

FIGS. 6 to 8 are diagrams illustrating a method for storing the mouse. FIG. 9 is a diagram illustrating a use state of the mouse.

First, the upper cover 75 of the mouse cable storage unit 60 is opened as illustrated in FIG. 6, and a mouse 100 is placed on the mouse storage unit 90. Then, a mouse cable 101 is hooked with the hook 64 while securing a length L of the mouse cable 101 extending outside the mouse cable storage unit 60.

Next, a remaining mouse cable 101 (i.e, a part other than the length L of the mouse cable 101) is wound around the winding units 63, and the USB connector 102 connected to one end of the mouse cable 101 is inserted into the connector 29B, as illustrated in FIG. 7. Since there are three winding units 63, the winding unit 63 around which the remaining mouse cable 101 is wound is selected appropriately from the three winding units 63 in consideration of the length of the remaining mouse cable 101, i.e., a winding position is adjusted so that the remaining mouse cable 101 does not get loose.

Then, the mouse cable 101 having the length L is taken out from the groove 77 to the outside of the mouse cable storage unit 60, and the upper cover 75 of the mouse cable storage unit 60 is closed as illustrated in FIG. 8. In this way, the mouse 100 is stored in the mouse storage unit 90, and the remaining mouse cable 101 is stored in the mouse cable storage unit 60.

When the user uses the mouse 100, the user moves the mouse 100 onto the upper surface 80 of the upper cover 75, and can operate the mouse 100 on the upper surface 80 of the upper cover 75, as illustrated in FIG. 9. The user returns the mouse 100 to the mouse storage unit 90 after the use of the mouse 100.

As described above, according to the present embodiment, the console drawer 1 includes: the mouse storage unit 90 storing the mouse 100; and the mouse cable storage unit 60 including the winding units 63 around which the mouse cable of the mouse 100 is wound. Therefore, the retrofitted mouse can be stored in the console drawer 1.

In the present embodiment, the mouse having the USB connector is used as the mouse 100, but a mouse having a PS/2 connector may be used as the mouse 100. In this case, another PS/2 connector is used as the connector 29B.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A console drawer to be mounted on a server rack, comprising:
    a mouse storage unit temporarily storing a mouse from which a cable extends;
    a mouse cable storage unit removably fixed to the console drawer and including a base unit, an opening in the base unit, and a cover to close the opening and define an interior of the mouse cable storage unit, and
    a winding unit in the interior around which the mouse cable is wound within the mouse cable storage unit,
    wherein the winding unit includes at least one body portion that is attached to the base unit to extend into the interior toward the cover around which the mouse cable is wound,
    wherein a top surface of the cover is a planar operation surface on which the mouse moves,
    wherein the cover is pivotably coupled to the base unit,
    wherein the at least one body portion is a plurality of body portions, and
    wherein the winding unit includes a head portion that is formed on an upper end of each of the body portions to suppress upward movement of the mouse cable wound around the body portions.

2. The console drawer as claimed in claim 1, wherein ribs formed on an inner surface of the cover to contact the head portions, respectively, when the cover closes the opening.

3. The console drawer as claimed in claim 1, wherein the base unit includes a hook defining a length of the mouse cable extending outside the mouse cable storage unit.

4. The console drawer as claimed in claim 1, wherein the base unit includes a protrusive unit projecting upward from a bottom surface of the base unit and having an opening for inserting a connector of the mouse cable into another connector, the another connector being arranged under the protrusive unit.

5. A console drawer to be mounted on a server rack, comprising:
    a mouse storage unit temporarily storing a mouse from which a cable extends;
    a mouse cable storage unit removably fixed to the console drawer and including a base an opening in the base, and a cover to close the opening and define an interior of the mouse cable storage unit, and
    a winding unit in the interior around which the mouse cable is wound within the mouse cable storage unit, wherein the winding unit includes at least one body portion that is attached to the base to extend into the interior toward the cover around which the mouse cable is wound, wherein a top surface of the cover is a planar operation surface on which the mouse moves, and wherein the mouse cable storage unit is removably fixed to the console drawer by one of holes and projections formed on the console drawer and the other of the holes and projections formed on the mouse cable storage unit.

6. The console drawer as claimed in claim 1, wherein at least one projection extends inwardly from the cover and contacts the winding unit to maintain the top surface planar when the top surface is used as an operation surface for the mouse.

7. A console drawer to be mounted on a server rack, comprising:

a mouse storage unit temporarily storing a mouse from which a cable extends; and a mouse cable storage unit removably fixed to the console drawer and including a winding unit around which the mouse cable is wound, wherein a top surface of the mouse cable storage unit is a planar operation surface on which the mouse moves, and wherein the mouse cable storage unit includes a base unit having an opening and an upper cover pivotably coupled with one end of the base unit, wherein the upper cover is movable between a first position closing the opening and a second position exposing the opening;

the base unit includes the winding unit, and the winding unit includes:

a body portion that stands up from a bottom surface of the base unit, and around which the mouse cable is wound; and a head portion that is formed on an upper end of the body portion to suppress the upward bulge of the mouse cable wound around the body portion.

8. The console drawer as claimed in claim 5, wherein at least one projection extends inwardly from the cover and contacts the winding unit to maintain the top surface planar when the top surface is used as an operation surface for the mouse.

9. The console drawer as claimed in claim 7, wherein at least one projection extends inwardly from the cover and contacts the winding unit to maintain the top surface planar when the top surface is used as an operation surface for the mouse.

* * * * *

UNITED STATES PATENT AND TRADEMARK OFFICE
CERTIFICATE OF CORRECTION

PATENT NO. : 10,149,403 B2
APPLICATION NO. : 15/233050
DATED : December 4, 2018
INVENTOR(S) : Kouji Iizuka Page 1 of 1

It is certified that error appears in the above-identified patent and that said Letters Patent is hereby corrected as shown below:

In the Claims

Column 6, Line 63:
In Claim 5, delete "base" and insert -- base, --, therefor.

Signed and Sealed this
Twenty-third Day of April, 2019

Andrei Iancu
*Director of the United States Patent and Trademark Office*